US008142694B2

(12) United States Patent
Tokue et al.

(10) Patent No.: US 8,142,694 B2
(45) Date of Patent: Mar. 27, 2012

(54) METHOD FOR FORMING AN IMPRINT PATTERN

(75) Inventors: Hiroshi Tokue, Yokohama (JP); Takumi Ota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 12/722,937

(22) Filed: Mar. 12, 2010

(65) Prior Publication Data

US 2010/0301508 A1    Dec. 2, 2010

(30) Foreign Application Priority Data

Jun. 2, 2009    (JP) ................................ P2009-132788

(51) Int. Cl.
B29C 45/76    (2006.01)
(52) U.S. Cl. .................... 264/40.1; 264/319; 425/436 R
(58) Field of Classification Search ................. 264/40.1, 264/319; 425/436 R
See application file for complete search history.

(56) References Cited

U.S. PATENT DOCUMENTS

| 6,870,301 | B2 * | 3/2005 | Choi et al. ..................... 310/311 |
| 7,803,308 | B2 * | 9/2010 | GanapathiSubramanian et al. ............... 264/334 |
| 2002/0056933 | A1 * | 5/2002 | Kamiguchi et al. ......... 264/40.1 |
| 2007/0246850 | A1 * | 10/2007 | Schumaker ................... 264/40.1 |
| 2008/0191372 | A1 | 8/2008 | Takaoka |
| 2008/0310702 | A1 | 12/2008 | Taguchi et al. |
| 2010/0052217 | A1 * | 3/2010 | Kasumi .......................... 264/293 |
| 2010/0078860 | A1 * | 4/2010 | Yoneda et al. ................. 264/496 |

FOREIGN PATENT DOCUMENTS

| EP | 1 072 954 A2 | 1/2001 |
| JP | 2000-194142 | 7/2000 |
| JP | 2001-68411 | 3/2001 |
| JP | 2006-190866 | 7/2006 |
| JP | 2008-194838 | 8/2008 |
| JP | 2008-224365 | 9/2008 |
| JP | 2008-246729 A * | 10/2008 |
| JP | 2008-279772 | 11/2008 |

* cited by examiner

*Primary Examiner* — Joseph Del Sole
*Assistant Examiner* — James Sanders
(74) *Attorney, Agent, or Firm* — Finnegan, Henderson, Farabow, Garrett & Dunner, L.L.P.

(57) ABSTRACT

A method for forming an imprint pattern includes: contacting a template having a first pattern with a curable material on a substrate to be treated and curing the curable material; releasing the template from the curable material after curing to form a second pattern made of the curable material such that the first pattern is transferred and formed as the second pattern for the substrate; measuring at least one of a load or time requiring for separation of the template when the template is separated from the curable material after transferring and forming; and comparing the load or time measured with a predetermined threshold value and determining whether the load or time measured is beyond the predetermined threshold value or not.

8 Claims, 5 Drawing Sheets

METHOD FOR FORMING AN IMPRINT PATTERN

CROSS-REFERENCE TO RELATED APPLICATIONS

This application is based upon and claims the benefit of priority from the prior Japanese Patent Application No. 2009-132788 filed on Jun. 2, 2009; the entire contents of which are incorporated herein by reference.

BACKGROUND OF THE INVENTION

1. Field of the Invention

The present invention relates to a method for forming an imprint pattern.

2. Description of the Related Art

With the development of the miniaturization of silicon semiconductor pattern, in the case where the patterning is conducted by using a photolithography apparatus, there are some problems in view of the requirement of the high accuracy and the like for the photolithography apparatus. Namely, the photolithography apparatus becomes expensive by itself and the processing cost for the silicon semiconductor pattern also becomes expensive so that the miniaturization cost for the silicon semiconductor pattern becomes expensive. Recently, therefore, an alternative technique to be substituted for the photolithography technique is desired as the silicon semiconductor patterning technique.

Recently, an attention is paid to an imprint method as introduced in References 1 and 2 where an original plate (template) with a pattern to be transferred is pressed against a photo-curable organic material layer (resist layer) coated on a substrate and then, the thus patterned resist layer is cured by means of light irradiation or thermal treatment so that the intended pattern is transferred and formed for the resist layer.

The imprint method can form a minute structure and is a patterning method of low cost. In the imprint method, however, since the template is directly contacted with the substrate to be treated, if the template is used repeatedly, some foreign matters may adhered on the template and the debris originated from the resist layer may stopped up into the trenches of the pattern of the template. In this point of view, in the following imprinting process, the common defects may be created originated from the foreign matters and the like, which is a problem for conducting the pattern formation for the substrate using the imprint method.

Therefore, after the template for the imprint method is used at a prescribed number of times, the template is required to be substituted with an alternative template. However, it is difficult to determine the timing in substitution of the template. If the substitution frequency of the template is set more, the throughput of the imprinting process may be deteriorated and the cost of the imprinting process may be increased because a large number of templates must be prepared. On the contrary, if the substitution frequency of the template is set less, the defects as described above may be created so that the yield ratio of the pattern formation for substrates to be treated may be deteriorated.

[Reference 1] JP-A 2001-68411 (KOKAI)
[Reference 2] JP-A 2000-194142 (KOKAI)

SUMMARY OF THE INVENTION

An aspect of the present invention relates to a method for forming an imprint pattern including: contacting a template having a first pattern with a curable material on a substrate to be treated and curing the curable material; releasing the template from the curable material after curing to form a second pattern made of the curable material such that the first pattern is transferred and formed as the second pattern for the substrate; measuring at least one of a load or time requiring for separation of the template when the template is separated from the curable material after transferring and forming; and comparing the load or time measured with a predetermined threshold value and determining whether the load or time measured is beyond the predetermined threshold value or not.

DETAILED DESCRIPTION OF THE INVENTION

Then, some embodiments will be described with reference to the drawings. Herein, the drawings are provided for illustration, but the present invention is not limited to the drawings.

Figure 1:
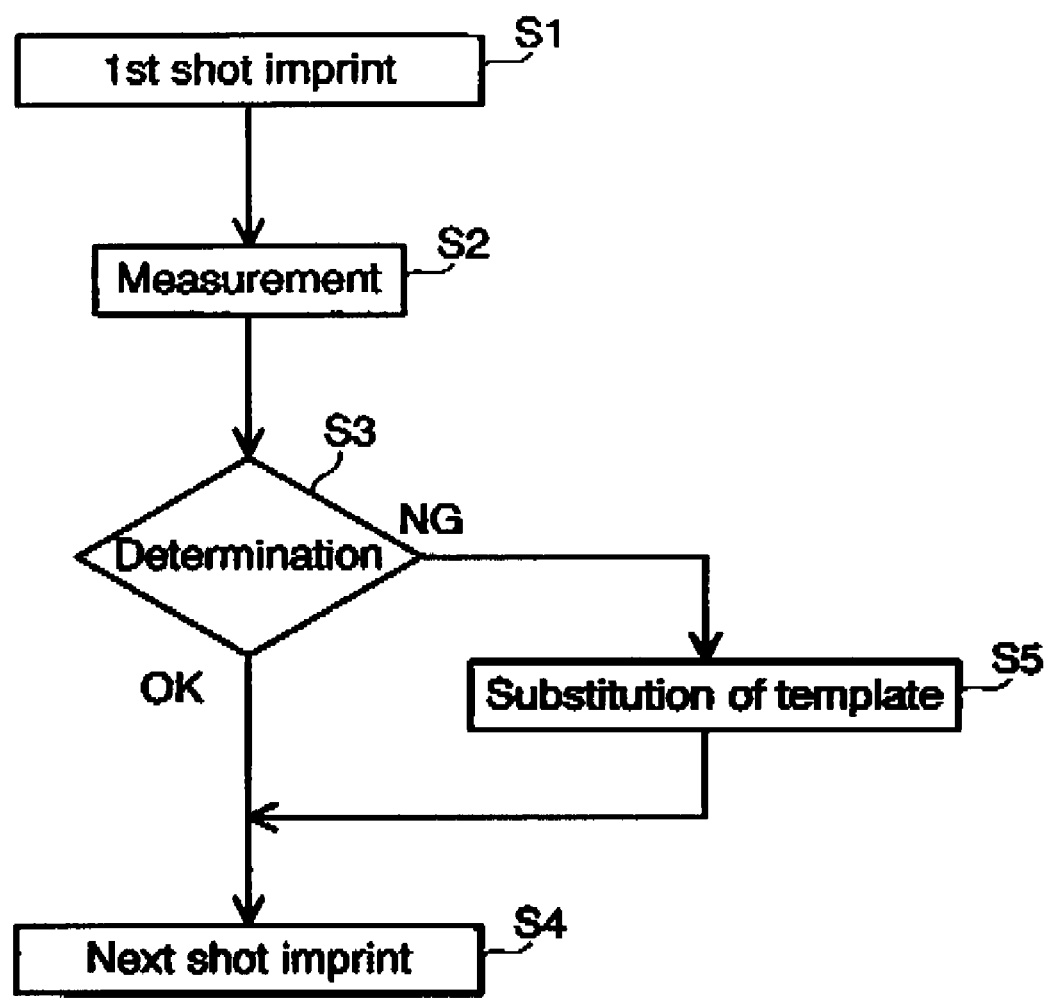
FIG. 1 is a flowchart for the forming method of imprint pattern according to an embodiment.

FIG. 1 is a flowchart for the forming method of imprint pattern according to an embodiment, and FIGS. 2 to 3 are step views relating to a pattern forming method using an imprint method at Steps S1 or S4 shown in FIG. 1. In this embodiment, the imprint method using light irradiation will be described.

In this embodiment, first of all, as shown in FIG. 1, a first pattern formation is conducted by the imprint method (Step S1).

Figure 2A:
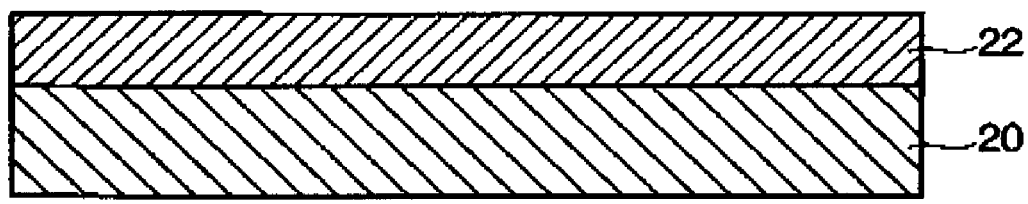
FIG. 2 is a step view relating to a pattern forming method using an imprint method.
Figure 2B:
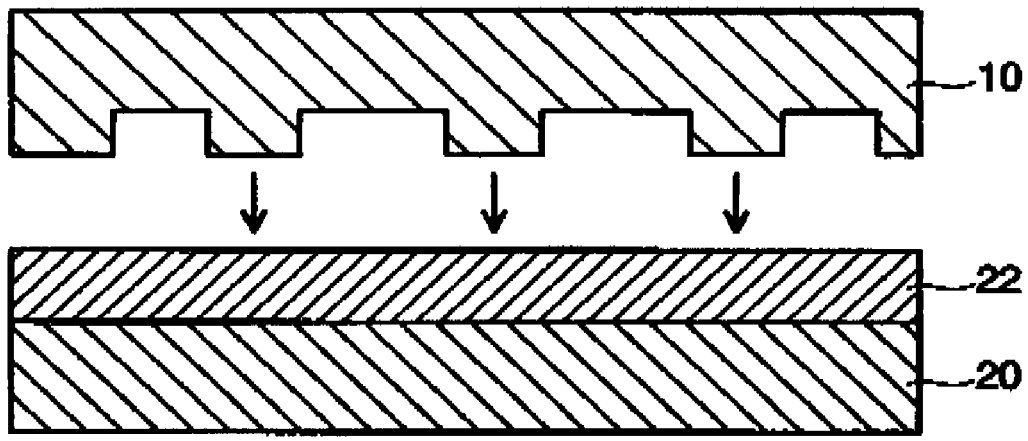
Figure 3A:
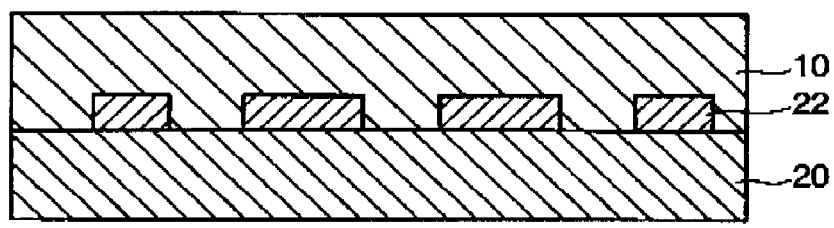
FIG. 3 is also a step view relating to a pattern forming method using an imprint method.

Concretely, as shown in FIG. 2A, a substrate 20 to be treated is prepared and a photo-curable material layer (hereinafter, called as a "resist layer" as occasion demands) 22 is formed on the substrate 20. The substrate 20, after a pattern is formed for the resist layer 22, is processed using the thus formed resist pattern as a mask, and may be made of a given substrate or film such as semiconductor substrate for any purpose. Then, as shown in FIG. 2B, the template 10 is relatively moved for the substrate 20 and thus, contacted with the substrate 20 such that the interiors of the depressed portions of the template 10 can be filled with the photo-curable material layer 22 as shown in FIG. 3A.

Figure 3B:
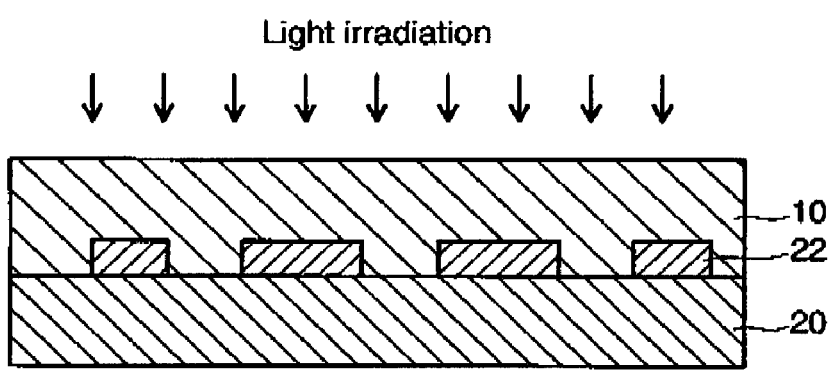

Then, as shown in FIG. 3B, a light (e.g., UV light) is irradiated for the photo-curable material layer 22 from the backside of the template 10 so as to cure the photo-curable material layer 22. Here, the template 10 is made of an optical transparent material. In this way, the photo-curable material layer 22 is cured on the condition that the photo-curable material layer 22 can have the convex-concave pattern corresponding to the convex-concave pattern formed at the surface of the template 10, namely the convex-concave pattern to be transferred onto the substrate 20. Here, since the light has only to cure the photo-curable material layer 22, the light is not always a light with a single wavelength or a light originated from a point light source which would be normally used for the photolithography, but may be a light originated from a normal lamp.

Figure 3C:
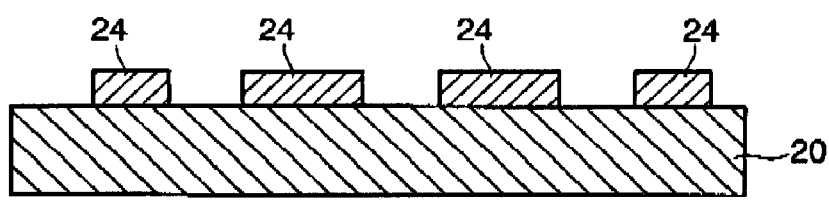

As shown in FIG. 3C, the template 10 is separated from the substrate 20 so that a patterned layer 24 is formed on the substrate 20 through the curing of the photo-curable material layer 22.

In the formation of the patterned layer 24, in this embodiment, when the template 10 is separated from the substrate 20, at least one of the load or the time requiring for the separation of the template 10 is measured (Step S2).

The load requiring for the separation of the template 10, namely the maximum value of the load applied for the period of time required in the separation of the template 10 can be measured by a load measuring monitor or the like attached to a driving device for moving the template 10 up or down, for example. The time requiring for the separation of the template 10 can be measured as the period of time from the starting point of the separation of the template 10, e.g., from the point when a load is applied to the template 10 in the direction opposite to the substrate 20 for the separation of the template 10 to the point when the load applied to the template 10 for the separation of the template 10 becomes zero, e.g., to the point when the template 10 is not contacted with the patterned layer 24.

Figure 4:
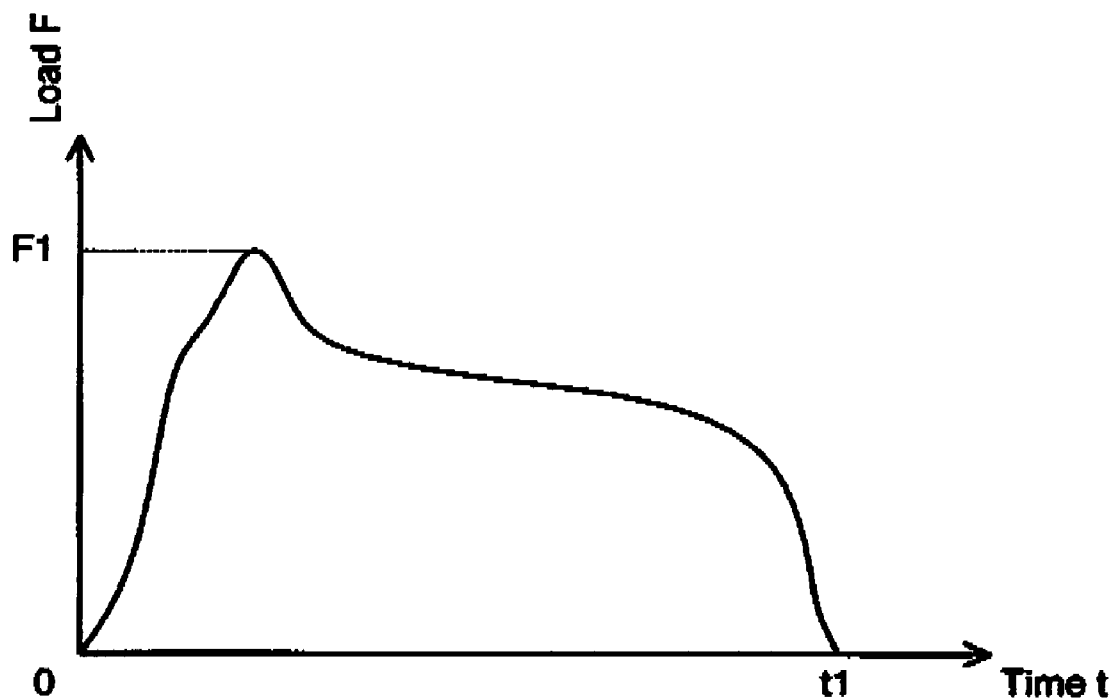
FIG. 4 is a graph showing the relation between the load and the time when a template is separated from a substrate to be treated.

In fact, since the relation between the load and the time requiring for the separation of the template 10 from the substrate 20 can be represented as shown in FIG. 4, the load requiring for the separation of the template 10 can be measured as "F1" in FIG. 4, for example and the time requiring for the separation of the template 10 can be measured as "t1" in FIG. 4, for example.

Then, the load or the time as measured above is compared with a predetermined threshold value (Step S3). The threshold value can be experimentally derived from the preliminary transfer and formation of a pattern for the substrate 20 using another template, e.g., with the same pattern density as the one of the template 10 or computationally derived from the pattern shape and the surface area of the template 10.

For example, the threshold value can be obtained from the simulation using CAD data. Concretely, first of all, the pattern surface area A of the template 10 is obtained. The pattern surface area A is defined by the area of the contact region between the pattern forming surface of the template 10 and the photo-curable material layer 22. The area also contains the area of the side surfaces of the trenches of the pattern of the template 10. Then, the pattern forming surface (two-dimensional surface) of the template 10 is divided into small regions, each region having an area of 1 cm×1 cm.

Then, the load requiring for separation (the separation load) or the time for separation (the separation time) is obtained per each of the small regions of the template 10. In the calculation, a pattern surface area B per each of the small regions, a wafer chucking force for fixing the substrate 20 onto a wafer, a template chucking force for fixing the template 10 onto an imprint device, a template moving-up velocity (predetermined value), the physical properties (size, Young's modulus, Poisson's ratio) of the template 10 and the physical properties (Young's modulus, curable ratio and the like) of the photo-curable material layer 22 are employed as parameters.

Then, the deformation volume of the template 10 and/or the obtained resist pattern during and after the separation of the template 10 is obtained using the separation load or the separation time per each of the small regions of the template 10, and the resist parameters such as the viscoelasticity of the resist (photo-curable material layer 22). In this way, the dimension of the resist pattern after the template is separated is obtained. Then, the separation load or the separation time is related with the dimension of the resist pattern per each of the small regions of the template 10 so that the separation load or the separation time when the change of the dimension of the resist pattern is beyond the allowable margin of the designed dimension (dependent on the kind of pattern of the resist pattern; e.g., within a margin of ±10% for the designed dimension of the resist pattern) are defined as the threshold of the separation load or the separation time. The change of the dimension of the resist pattern can be obtained referring to the change of the pattern surface area thereof. The pattern surface area contains not only the areas of the convex portions of the resist pattern but also the areas of the side surfaces of the depressed portions of the resist pattern. Therefore, if the separation loads or the separation times when the pattern surface area corresponds to the upper limit of the allowable margin of the designed dimension and when the pattern surface area corresponds to the lower limit of the allowable margin of the designed dimension are obtained, the thus obtained separation loads or the separation times can be defined as the threshold value thereof.

When the template 10 is stopped up to reduce the pattern surface area, the separation load F2 tends to be decreased and the separation time t2 tends to be increased. When the template 10 is damaged to increase the pattern surface area, the separation load F2 tends to be increased and the separation time t2 tends to be decreased.

Figure 5A:
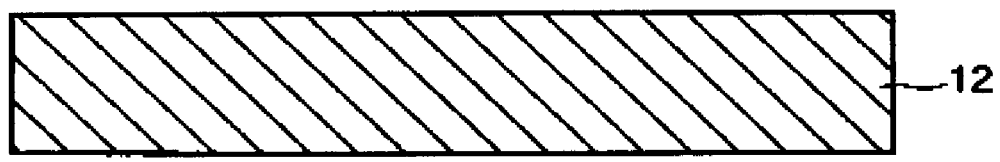
FIG. 5 is an explanatory view for the manufacturing process of the template.
Figure 5B:
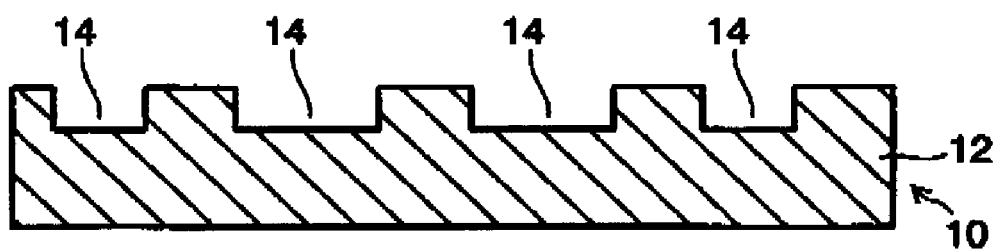

The template 10 can be manufactured as follows. First of all, as shown in FIG. 5A, a substrate 12 made of an optical transparent material such as quartz or PYREX (Registered trademark) is prepared as a base of the template 10. Then, as shown in FIG. 5B, an invert pattern corresponding to the mirror image of the pattern to be transferred is formed at the surface of the substrate 12. The invert pattern is obtained by processing the surface of the substrate 12 to form trenches 14 corresponding to the invert pattern. The trenches 14 can be formed by means of electron beam lithography. As a result, the template 10 with the invert pattern corresponding to the mirror image to be transferred can be obtained from the substrate 12.

Then, as shown in FIG. 1, whether the separation load or the separation time measured at Step S2 is beyond the obtained threshold value is determined (Step 3). When the measured separation load or separation time is not beyond the threshold value, the template 10 is continuously used to conduct the next imprint shot (Step S4). On the contrary, when the measured separation load or separation time is beyond the threshold value, it is determined that the patterned layer 24 is no longer formed as designed so that the template 10 is substituted with a new template (Step S6). Thereafter, the next imprint shot is conducted using the new template (Step S4).

In the imprint method according to this embodiment, the timing in substitution of the template after imprint shot can be determined based on the separation load or the separation time of the template at imprint Therefore, the substitution frequency of the template can be determined effectively and efficiently so that the deterioration of the throughput of the imprinting process, which is originated from the increase of the substitution frequency, can be prevented and the deterioration of the yield ratio of the pattern formation of the imprinting process, which is originated from the decrease of the substitution frequency, can be prevented.

Although the present invention was described in detail with reference to the above examples, this invention is not limited to the above disclosure and every kind of variation and modification may be made without departing from the scope of the present invention.

For example, in this embodiment, the imprint method using the light irradiation is described, but the present invention can be applied for the imprint method using thermal treatment. In the latter case, the thermal treatment is conducted instead of the light irradiation as shown in FIG. 3B and the template is not required to be optically transparent.

What is claimed is:

1. A method for forming an imprint pattern, comprising:
   contacting a template having a first pattern with a curable material on a substrate to be treated and curing the curable material;
   releasing the template from the curable material after curing to form a second pattern made of the curable material such that the first pattern is transferred and formed as the second pattern for the substrate;
   measuring at least one of a load or time requiring for separation of the template when the template is separated from the curable material after transferring and forming; and
   comparing the load or time measured with a predetermined threshold value and determining whether the load or time measured is beyond the predetermined threshold value or not; wherein the predetermined threshold value is determined computationally on a pattern surface area of the template; wherein the predetermined threshold value is calculated by obtaining the pattern surface area of the template, dividing a pattern forming surface of the template into small regions, obtaining the load or time requiring for the separation of the template per each of the small regions, obtaining deformation volume of the template during and after the separation of the template so that a dimension of the second pattern after the template is separated is obtained, and comparing the pattern surface area of the second pattern with a designed dimension and an allowable margin thereof so as to obtain, as the predetermined threshold value, separation loads or separation times at an upper limit value and lower limit value of the pattern surface area of the second pattern based on the designed dimension and the allowable margin.

2. The method as set forth in claim 1, wherein if the load or time measured is beyond the threshold value, the template is substituted with an alternative template.

3. The method as set forth in claim 1, wherein if the load or time measured is not beyond the threshold value, the template is continuously used.

4. The method as set forth in claim 1, wherein the load is measured as a maximum load when the template is separated from the curable material.

5. The method as set forth in claim 1, wherein the time is measured as a period of time from a point when the load starts to be applied to the template in a direction opposite to the substrate for the separation of the template to the point when the load applied to the template for the separation of the template becomes zero.

6. The method as set forth in claim 1, wherein the predetermined threshold value is determined experimentally on a preliminary transfer and formation of a pattern for the substrate using another template with the same pattern density as the template.

7. The method as set forth in claim 1, wherein the curable material is a photo-curable material.

8. The method as set forth in claim 1, wherein the curable material is a thermal-curable material.

* * * * *